(12) United States Patent
Nagahara et al.

(10) Patent No.: US 11,682,536 B2
(45) Date of Patent: Jun. 20, 2023

(54) PARTICLE BEAM APPARATUS AND COMPOSITE BEAM APPARATUS

(71) Applicant: HITACHI HIGH-TECH SCIENCE CORPORATION, Tokyo (JP)

(72) Inventors: Koji Nagahara, Tokyo (JP); Yuichi Madokoro, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 17/202,993

(22) Filed: Mar. 16, 2021

(65) Prior Publication Data

US 2021/0296079 A1 Sep. 23, 2021

(30) Foreign Application Priority Data

Mar. 18, 2020 (JP) .............................. JP2020047417

(51) Int. Cl.
*H01J 37/12* (2006.01)
*H01J 37/147* (2006.01)
*H01J 37/244* (2006.01)

(52) U.S. Cl.
CPC .......... *H01J 37/12* (2013.01); *H01J 37/1472* (2013.01); *H01J 37/244* (2013.01); *H01J 2237/0473* (2013.01); *H01J 2237/04756* (2013.01); *H01J 2237/2448* (2013.01); *H01J 2237/31749* (2013.01)

(58) Field of Classification Search
CPC ...... H01J 37/12; H01J 37/1472; H01J 37/244; H01J 2237/0473; H01J 2237/04756; H01J 2237/2448; H01J 2237/31749; H01J 2237/0042; H01J 37/3053; H01J 37/026; H01J 37/261; H01J 37/05; H01J 37/28; H01J 37/3002; H01J 37/3056;
(Continued)

(56) References Cited

U.S. PATENT DOCUMENTS 11,152,189 B2 * 10/2021 Bishop ................ H01J 37/244
2018/0076001 A1 * 3/2018 Asahata .............. H01J 37/3056

FOREIGN PATENT DOCUMENTS

JP 2018-45811 A 3/2018

OTHER PUBLICATIONS

Seiji Samukawa "Suppression of Atomic-Layer-Level Surface Defect and Control of Chemical Reaction on Surface Through Neutral Particle Beam Process", Applied Physics, vol. 83, No. 11, 2014, pp. 894-899.

* cited by examiner

*Primary Examiner* — David A Vanore
(74) *Attorney, Agent, or Firm* — Holland & Hart LLP

(57) ABSTRACT

Provided is a particle beam apparatus capable of performing appropriate switching selectively between charged particle beam and neutral particle beam. A particle beam column (19) includes an ion source (41), a condenser lens (52), a charge exchange grid (55), and an objective lens (56). The ion source (41) generates ions. The condenser lens (52) changes focusing of the ion beam so that switching is performed between ion beam and neutral beam as particle beam with which a sample (S) is irradiated. The charge exchange grid (55) converts at least a part of ion beam into neutral particle beam through neutralization. The objective lens (56) is placed downstream of the charge exchange grid (55). The objective lens (56) reduces the ion beam toward the sample (S) when the sample (S) is irradiated with the neutral particle beam as the particle beam.

6 Claims, 13 Drawing Sheets

(58) Field of Classification Search
CPC ........... H01J 2237/12; H01J 2237/2801; H01J 2237/3151; H01J 37/141; H01J 37/147
See application file for complete search history.

PARTICLE BEAM APPARATUS AND COMPOSITE BEAM APPARATUS

CROSS REFERENCE TO RELATED APPLICATION(S)

This application claims the benefit of Japanese Patent Application No. 2020-047417, filed Mar. 18, 2020, which is hereby incorporated by reference in its entirety into this application.

BACKGROUND OF THE INVENTION

1. Technical Field

The present disclosure relates to a particle beam apparatus and a composite beam apparatus.

2. Description of the Related Art

In the related art, micron-level local processing using a focused ion beam (FIB) device is performed, for example, for analysis of semiconductor failure, and the like. For example, a charged particle beam apparatus including an FIB device and a scanning electron microscope (SEM) is capable of performing observation based on a secondary electron image of an irradiation target, such as a sample, etc., and sputtering processing with high-energy ion beam.

However, high-energy ions damage a surface of the sample, resulting in an obstacle to observation. To overcome the problem, as an FIB device capable of operating at a low acceleration voltage, for example, a processing device for removing surface damage by using ion beam of a low-energy noble gas is known. However, low-energy ion beam have weaker beam convergence than high-energy ion beam, so it is difficult to observe a state of a processing point by using a secondary electron image in the middle of processing. For this reason, for example, a process of repeating transfer of a sample between a processing device using ion beam and an electron microscope and gradually optimizing the finish state of the sample is required. Unfortunately, this is complex.

In the related art, a nanodevice processing method that limits generation of a surface defect by using neutral particle beam is known (for example, see Non-patent Document 1).

In the related art, a composite beam apparatus that includes a focused ion beam column, an electron beam column, and a neutral particle beam column, wherein a sample is processed using focused ion beam, a scanning electron microscope (SEM) image acquired by electron beam is observed, and finish processing is performed on a surface of the sample by using neutral particle beam is known (for example, see Patent Document 1).

DOCUMENTS OF RELATED ART (Patent Document) Japanese Patent Application Publication No. 2018-45811
(Non-patent Document) Seiji Samukawa, "SUPPRESSION OF ATOMIC-LAYER-LEVEL SURFACE DEFECT AND CONTROL OF CHEMICAL REACTION ON SURFACE THROUGH NEUTRAL PARTICLE BEAM PROCESS", Applied Physics, Vol. 83, No. 11, 2014, pp 894-899

SUMMARY OF THE INVENTION

In a neutral particle beam column of the composite beam apparatus, a neutralization unit provided downstream of an objective lens focusing ion beam on a sample generates neutral particle beam from the ion beam. However, regarding the neutralization unit provided downstream of the objective lens, there is a concern that the sample may be irradiated with the ion beam which are not converted into neutral particle beam in a mode in which the sample is irradiated with the neutral particle beam.

The present disclosure is directed to providing a particle beam apparatus and a composite beam apparatus that are capable of performing appropriate switching selectively between charged particle beam and neutral particle beam.

According to the present disclosure, there is provided a particle beam apparatus including: a particle beam column irradiating a sample with particle beam; a charged particle source, which is provided inside the particle beam column and generates charged particles; a conversion unit converting at least a part of the beam of charged particles generated from the charged particle source to a beam of neutral particles by neutralization inside the particle beam column; a switching unit switching between a beam of charged particles and a beam of neutral particles as the particle beam inside the particle beam column; and a reduction unit, which is provided downstream of the conversion unit and reduces the beam of the charged particles directed towards the sample.

In the configuration, the switching unit may include an electrostatic lens for switching between the beam of the charged particles and the beam of the neutral particles as the particle beam according to a change in lens power related to a focal length of the beam of the charged particles.

In the configuration, the switching unit may include at least one deflector for switching between a beam of the charged particles and a beam of the neutral particles as the particle beam depending on deflection of the beam of the charged particles.

In the configuration, the at least one deflector may include an upstream deflector that is provided upstream of the conversion unit and deflects the beam of the charged particles so as to direct the beam of the charged particles to the conversion unit or away from the conversion unit.

In the configuration, the reduction unit may include an objective lens that is provided downstream of the conversion unit, the objective lens being applied a voltage for decelerating to block the beam of the charged particles.

In the configuration, the particle beam apparatus may further include a blocking unit, which is provided upstream of the conversion unit inside the particle beam column and blocks the beam of the charged particles.

In the configuration, the particle beam apparatus may further include an acceleration electrode accelerating the beam of charged particles inside the particle beam column.

According to the present disclosure, there is provided a composite beam apparatus including: the particle beam apparatus; and a detector detecting secondary charged particles generated from the sample by irradiation with the beam of the charged particles.

In the configuration, the composite beam apparatus may further include an electron beam column irradiating the sample with electron beam.

In the configuration, the composite beam apparatus may further include a focused ion beam column irradiating the sample with focused ion beam.

According to the present disclosure, the reduction unit reducing the beam of the charged particles is provided downstream of the conversion unit converting the beam of the charged particles into the beam of the neutral particles, so that when the sample is irradiated with the beam of the neutral particles, the beam of the charged particles not subjected to neutralization are limited not to irradiate the sample, and appropriate switching selectively between the beam of the charged particles and the beam of the neutral particles is achieved.

BRIEF DESCRIPTION OF THE DRAWINGS

The above and other objectives, features, and advantages of the present disclosure will be more clearly understood from the following detailed description taken in conjunction with the accompanying drawings, in which.

DESCRIPTION OF THE PREFERRED EMBODIMENTS

Hereinafter, a composite beam apparatus 10 including a particle beam apparatus 1 according to an embodiment of the present disclosure will be described with reference to the accompanying drawings.

(Composite Beam Apparatus)

Figure 1:
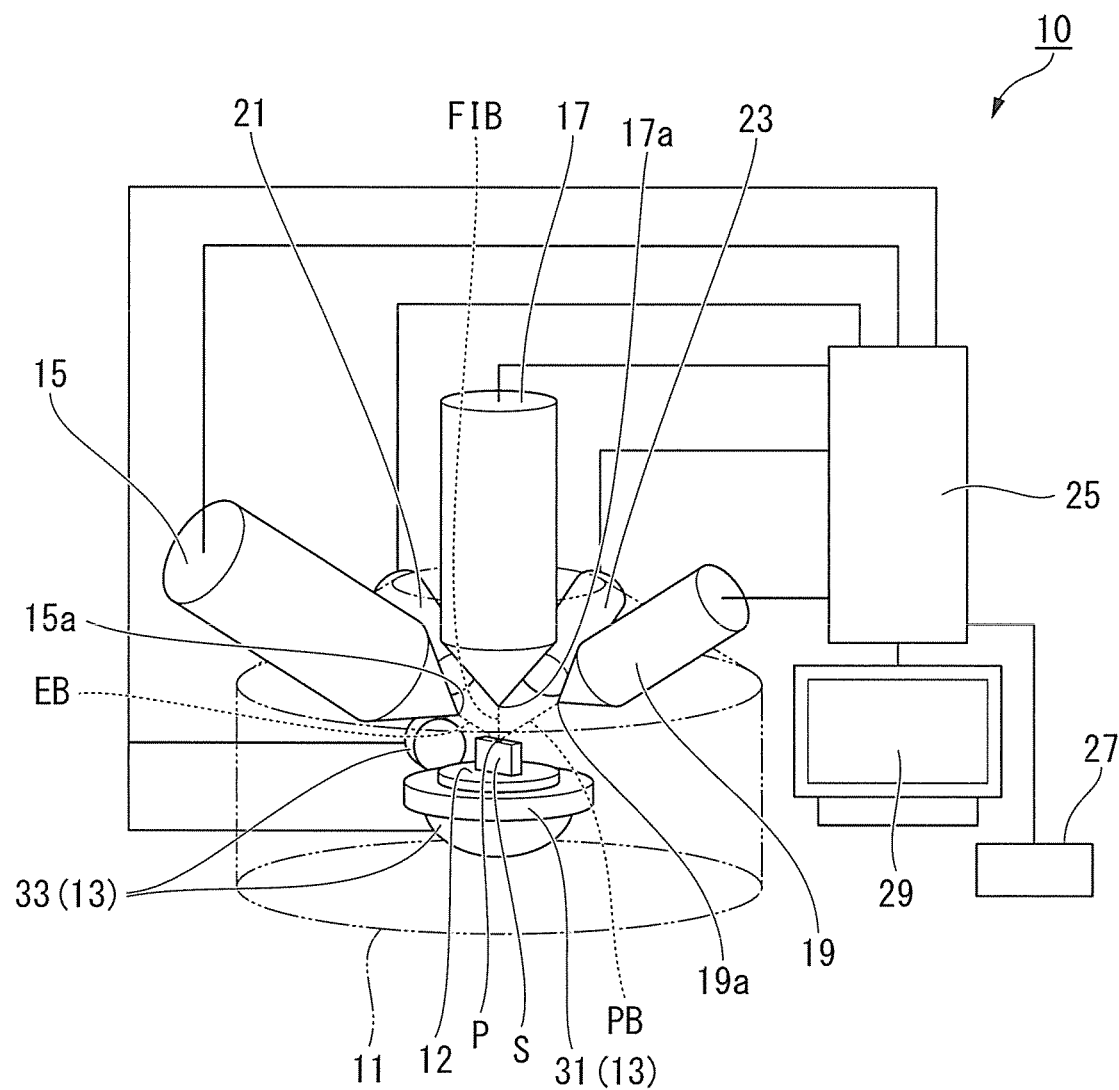
FIG. 1 is a diagram showing a configuration of a composite beam apparatus according to an embodiment of the present disclosure.

FIG. 1 is a diagram showing a configuration of a composite beam apparatus 10 according to an embodiment.

The composite beam apparatus 10 includes a sample chamber 11, a sample holder 12, a sample plate 13, an electron beam column 15, a focused ion beam column 17, and a particle beam column 19, wherein the columns are fixed in the sample chamber 11.

The composite beam apparatus 10 includes a secondary charged particle detector 21, for example, as a detector fixed in the sample chamber 11. The composite beam apparatus 10 includes a gas supply unit 23 supplying gas to a surface of a sample S. The composite beam apparatus 10 includes a control device 25, an input device 27, and a display device 29. Outside the sample chamber 11, the control device 25 controls overall operation of the composite beam apparatus 10. The input device 27 and the display device 29 are connected to the control device 25.

In addition, in the following, axis directions of an X-axis, a Y-axis, and a Z-axis perpendicular to each other in a three-dimensional space are parallel to their axes, respectively. For example, the Z-axis direction is parallel to the upward-downward direction (for example, the vertical direction) of the composite beam apparatus 10. The X-axis direction and the Y-axis direction are parallel to a reference plane (for example, the horizontal plane) perpendicular to the upward-downward direction of the composite beam apparatus 10.

The sample chamber 11 is a pressure-resistant housing having an airtight structure where internal pressure is maintained at a desired reduced state. In the sample chamber 11, exhausting is able to be performed by an exhaust device (not shown) until internal pressure approaches a desired reduced state.

The sample holder 12 fixes the sample S.

The sample plate 13 is placed inside the sample chamber 11. The sample plate 13 includes a stage 31 supporting the sample holder 12, and a stage driving unit 33 translating and rotating the stage 31, together with the sample holder 12, in three dimensions.

The stage driving unit 33 translates the stage 31 in the axis directions of the X-axis, the Y-axis, and the Z-axis, for example. The stage driving unit 33 rotates the stage 31 around a predetermined rotating axis and a predetermined tilt axis at an appropriate angle, for example. The rotating axis is, for example, set relative to the stage 31, and when the stage 31 is at a predetermined reference position around the tilt axis (T-axis), the rotating axis is parallel to the upward-downward direction of the composite beam apparatus 10. The tilt axis is, for example, parallel to a direction perpendicular to the upward-downward direction of the composite beam apparatus 10. The stage driving unit 33 rotates the stage 31 around the rotating axis and the tilt axis in an eucentric manner, for example. The stage driving unit 33 is controlled by a control signal output from the control device 25 according to an operation mode of the composite beam apparatus 10, and the like.

The electron beam column 15 irradiates, with an electron beam EB, an irradiation target within a predetermined irradiation region inside the sample chamber 11. The electron beam column 15 makes, for example, a beam emitting end portion 15a for the electron beam face the stage 31 in a first tilt direction that is tilted at a predetermined angle with respect to the upward-downward direction of the composite beam apparatus 10. The electron beam column 15 makes an optical axis of the electron beam parallel to the first tilt direction, and is fixed in the sample chamber 11.

The electron beam column 15 includes an electron source generating electrons, and electron optics focusing and deflecting electrons emitted from the electron source. The electron optics includes, for example, an electron lens, a deflector, and the like. The electron source and the electron optics are controlled by a control signal output from the control device 25 according to an irradiation position, an irradiation condition of electron beam, and the like.

The focused ion beam column 17 irradiates, with a focused ion beam FIB, the irradiation target within the predetermined irradiation region inside the sample chamber 11. The focused ion beam column 17 makes, for example, a beam emitting end portion 17a for the focused ion beam face the stage 31 in the upward-downward direction of the composite beam apparatus 10. The focused ion beam column 17 makes an optical axis of the focused ion beam parallel to the upward-downward direction, and is fixed in the sample chamber 11.

The focused ion beam column 17 includes an ion source generating ions, and ion optics focusing and deflecting ions drawn out of the ion source. The ion optics includes, for example, a first electrostatic lens, such as a condenser lens, etc., an electrostatic deflector, and a second electrostatic lens, such as an objective lens, etc. The ion source and the ion optics are controlled by a control signal output from the control device 25 according to an irradiation position, an irradiation condition of focused ion beam, and the like. The ion source is, for example, a liquid metal ion source using liquid gallium, etc., a plasma ion source, a gas field ion source, or the like.

The particle beam column 19 irradiates, with a particle beam PB, such as an ion beam or a neutral particle beam, the irradiation target within the predetermined irradiation region inside the sample chamber 11. The particle beam column 19 makes, for example, a beam emitting end portion 19a for each beam face the stage 31 in a second tilt direction that is different from the tilt direction in which the electron beam column 15 is placed and is tilted at a predetermined angle with respect to the upward-downward direction of the composite beam apparatus 10. The particle beam column 19 makes an optical axis of each beam parallel to the second tilt direction, and is fixed in the sample chamber 11.

The particle beam apparatus 1 including the particle beam column 19 in an embodiment will be described later.

The optical axis of the electron beam column 15, the optical axis of the focused ion beam column 17, and the optical axis of the particle beam column 19 intersect at a predetermined position P above the sample plate 13, for example.

In addition, the arrangement of the electron beam column 15, the focused ion beam column 17, and the particle beam column 19 may be appropriately changed. For example, the electron beam column 15 or the particle beam column 19 may be placed in the upward-downward direction and the focused ion beam column 17 may be placed in a tilt direction tilted with respect to the upward-downward direction.

The composite beam apparatus 10 emits focused ion beam or particle beam to scan and irradiate the surface of the irradiation target, such that imaging of an irradiated part, various types of processing (excavating, trimming processing, etc.) by sputtering, forming of a deposition film, and the like are able to be performed. The composite beam apparatus 10 is capable of performing processing of forming, from the sample S, a sample piece (for example, a lamella sample, a needle-shaped sample, etc.) for transmission-observation using a transmission electron microscope and a sample piece for analysis using electron beam. The composite beam apparatus 10 is capable of performing processing of the sample piece transferred to a sample piece holder into a thin film in a desired thickness that is appropriate for transmission-observation using the transmission electron microscope. The composite beam apparatus 10 emits focused ion beam, particle beam, or electron beam to scan and irradiate the surface of the irradiation target, such as the sample S, the sample piece, a needle, etc., thereby performing observation of the surface of the irradiation target.

The secondary charged particle detector 21 detects secondary charged particles (secondary electrons and secondary ions) generated from the irradiation target due to irradiation with the focused ion beam, the particle beam, the electron beam, or the like. The secondary charged particle detector 21 is connected to the control device 25, and a detection signal output from the secondary charged particle detector 21 is transmitted to the control device 25.

Without being limited to the secondary charged particle detector 21, the composite beam apparatus 10 may include other detectors. For example, the detectors include an energy dispersive X-ray spectrometer (EDS) detector, a back-scattered electron detector, an electron back-scattering diffraction (EBSD) detector, and the like. The EDS detector detects X-rays generated from the irradiation target due to irradiation with the electron beam. The back-scattered electron detector detects back-scattered electrons back-scattered from the irradiation target due to irradiation with the electron beam. The EBSD detector detects an electron-beam back-scattering diffraction pattern generated from the irradiation target due to irradiation with the electron beam. In addition, in the secondary charged particle detector 21, the secondary electron detector detecting secondary electrons and the back-scattered electron detector may be provided in a housing of the electron beam column 15.

The gas supply unit 23 is fixed in the sample chamber 11. The gas supply unit 23 includes a gas spray part (nozzle) that is provided facing the stage 31. The gas supply unit 23 supplies etching gas, deposition gas, and the like to the irradiation target. The etching gas stimulates etching of the irradiation target by the focused ion beam selectively depending on the material of the irradiation target. The deposition gas forms, on the surface of the irradiation target, a deposition film made of a deposit, such as metal, an insulator, or the like.

The gas supply unit 23 is controlled by a control signal output from the control device 25 depending on the operation mode of the composite beam apparatus 10, and the like.

The control device 25 controls overall operation of the composite beam apparatus 10 depending on, for example, a signal output from the input device 27 or a signal generated by preset automatic operation control processing.

The control device 25 is, for example, a software functional unit that functions as a predetermined program is executed by a processor, such as a central processing unit (CPU), or the like. The software functional unit is an electronic control unit (ECU) including a processor, such as an CPU, etc., a read only memory (ROM) storing a program, a random access memory (RAM) temporarily storing data, and an electronic circuit, such as a timer, etc. At least a part of the control device 25 may be an integrated circuit, such as large scale integration (LSI), or the like.

The input device 27 is, for example, a mouse, a keyboard, and the like that output a signal in consequence of input operation of an operator.

The display device 29 displays various types of information of the composite beam apparatus 10, image data generated by a signal output from the secondary charged particle detector 21, and a screen for executing operations, such as zoom-in, zoom-out, shift, rotation, and the like of the image data.

(Particle Beam Apparatus)

Figure 2:
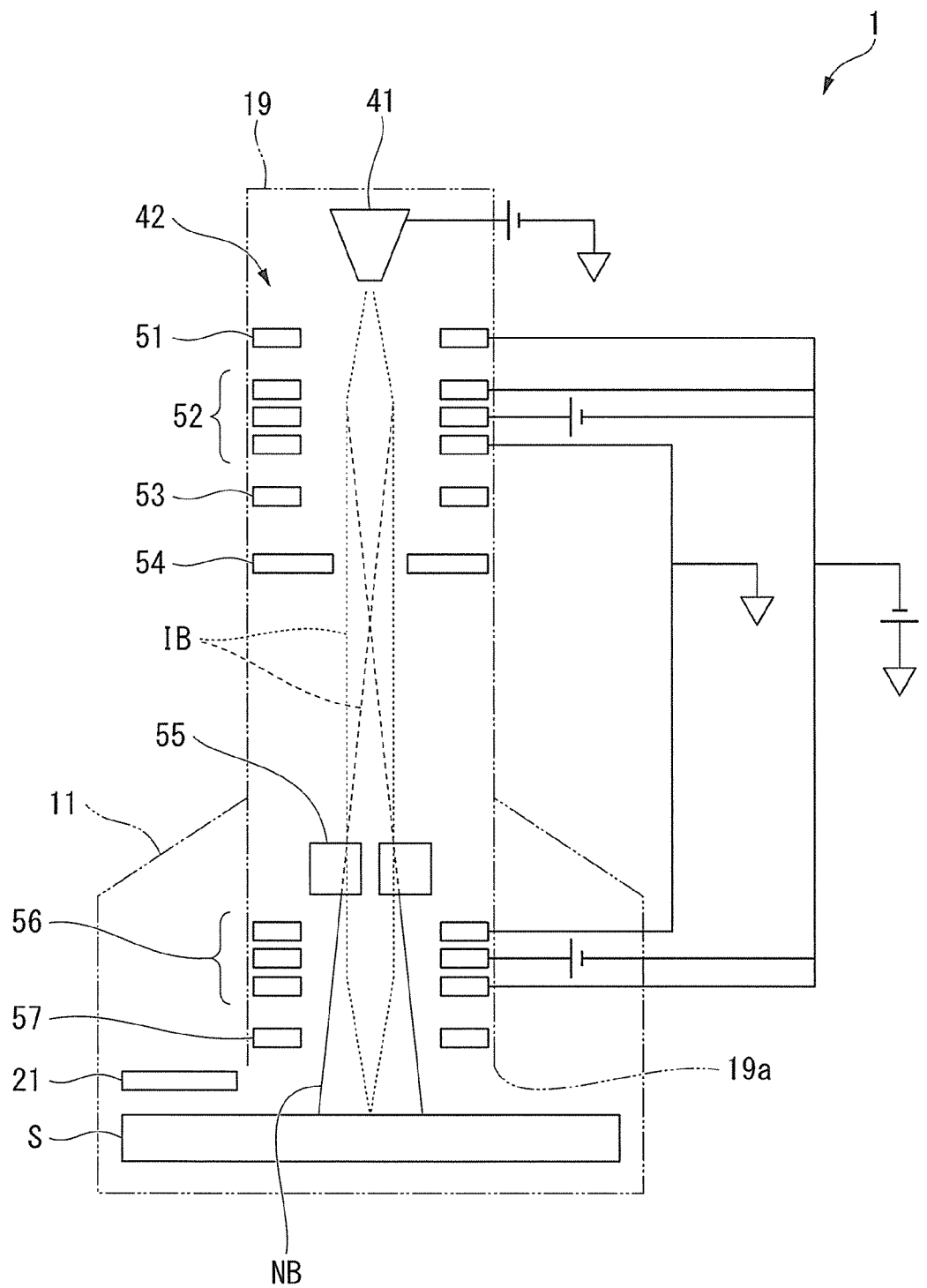
FIG. 2 is a diagram schematically showing a configuration of a particle beam apparatus according to an embodiment of the present disclosure.

FIG. 2 is a diagram showing a configuration of a particle beam apparatus 1 including a particle beam column 19 according to an embodiment.

The particle beam apparatus 1 is, for example, a gas ion beam apparatus. The particle beam column 19 is fixed in the sample chamber 11. The particle beam column 19 includes an ion source 41 and ion optics 42. The ion source 41 and the ion optics 42 are controlled by a control signal output from the control device 25 according to an irradiation position, an irradiation condition of particle beam, and the like.

The ion source 41 generates ions. The ion source 41 is, for example, a Penning ionization gauge (PIG) ion source, or the like, and generates ions of the noble gases, such as argon (Ar), etc., or ions of other gases, such as oxygen, etc.

For example, the ion source 41 may enable acceleration voltage to range from 200 V to 5 kV. When the acceleration voltage is 1 kV, a particle current of 20 nA for ion beam and a particle current of 5 nA for neutral particle beam are generated on the sample S. The image resolution of a secondary electron image acquired by the ion beam having the acceleration voltage of 1 kV is about 50μ.

The ion optics 42 focuses, deflects, and neutralizes ions drawn out of the ion source 41. The ion optics 42 includes the following placed sequentially starting from the ion source 41 toward the beam emitting end portion 19a of the particle beam column 19 (that is, toward the sample S): an extraction electrode 51, a condenser lens 52, a blanker 53, a blanking aperture 54, a charge exchange grid 55, an objective lens 56, and a deflector 57, for example.

The extraction electrode 51 causes ions to be extracted from the ion source 41 by an electric field generated between the ion source 41 and the extraction electrode 51. The voltage applied to the extraction electrode 51 is, for example, controlled according to the acceleration voltage of the ion beam.

The condenser lens 52 is, for example, an electrostatic lens that has three electrodes arranged in an optical axis. The condenser lens 52 focuses the ion beam extracted from the ion source 41 by the extraction electrode 51. In the condenser lens 52, the lens power related to a focal length of the ion beam is changed depending on a mode in which the particle beam column 19 emits the ion beam as particle beam to the sample S for irradiation and a mode in which the particle beam column 19 emits the neutral particle beam as particle beam to the sample S for irradiation. For example, in the mode in which the particle beam column 19 emits the neutral particle beam as particle beam to the sample S for irradiation, a voltage applied to the condenser lens 52 is adjusted so that ion beam spread more widely in the charge exchange grid 55, which will be described later, compared to the mode in which the particle beam column 19 emits the ion beam to the sample S for irradiation.

The blanker 53 includes, for example, one pair of electrodes (blanking electrodes) that are placed facing each other, with the optical axis between opposite sides in a direction intersecting the traveling direction of the ion beam. The blanker 53 switches between blocking the ion beam and canceling the blocking. For example, the blanker 53 blocks the ion beam by deflecting and making the ion beam collide with the blanking aperture 54, and cancels the blocking by not deflecting the ion beam.

Figure 3:
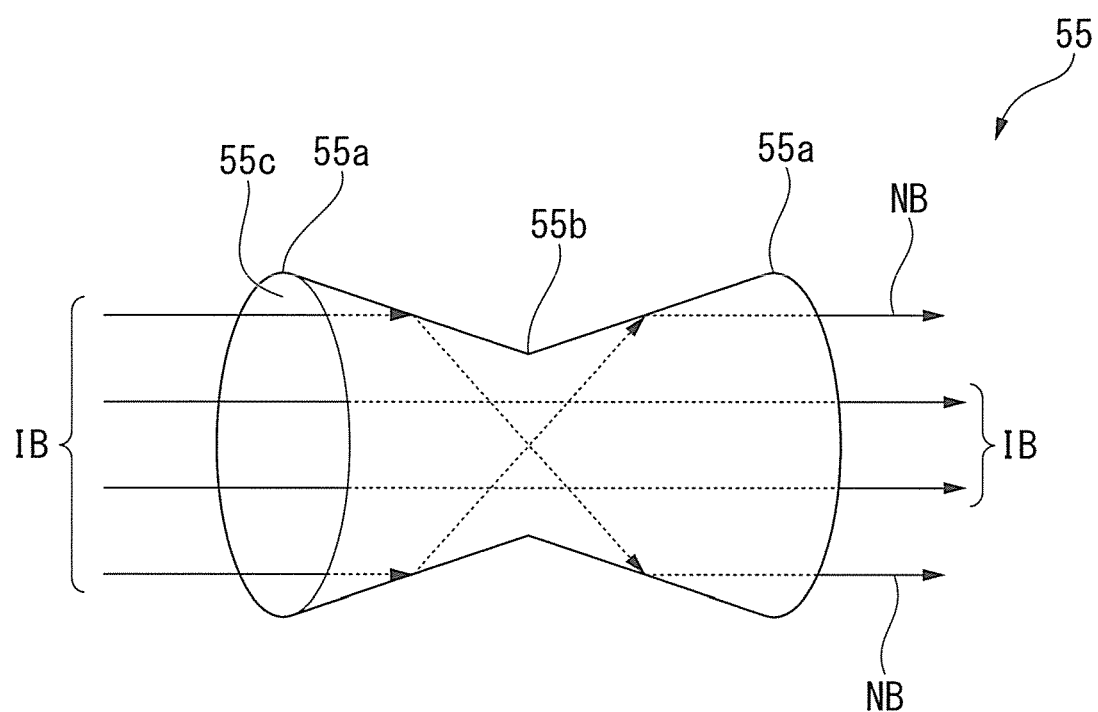
FIG. 3 is a diagram schematically showing a configuration of a charge exchange grid of a particle beam apparatus according to an embodiment of the present disclosure.

FIG. 3 is a diagram schematically showing a configuration of the charge exchange grid 55 of the particle beam apparatus 1 according to an embodiment.

The charge exchange grid 55 is made of a metal in a predetermined shape in which the ion beam are not blocked and at least a part of the ion beam collides once or more times. The outward shape of the charge exchange grid 55 is, for example, a tube shape of which the central axis matches the optical axis of the ion beam. The charge exchange grid 55 has an inner circumferential surface 55c in a concave curved shape in which the inside diameter gradually decreases starting from axis-direction opposite ends 55a toward an axis-direction center 55b.

The charge exchange grid 55 performs charge exchange by making electrons absorbed by a part of ions that are incident at a shallow angle on the inner circumferential surface 55c, whereby the ions are converted into neutral particles. In the example shown in FIG. 3, among ion beam IBs incident on the inside of the charge exchange grid 55, the neutral particle beam NBs neutralized by charge exchange and the remaining ion beam IB which are not subjected to charge exchange are emitted out of the inside of the charge exchange grid 55 toward the objective lens 56.

As shown in FIG. 2, the objective lens 56 is, for example, an electrostatic lens that has three electrodes arranged in the optical axis. The objective lens 56 includes, for example, as a center electrode or the like, a retarding electrode to which a voltage for forming an electric field decelerating ion beam is applied.

In the mode in which the particle beam column 19 emits ion beam as particle beam to the sample S for irradiation, the objective lens 56 focuses the ion beam onto the sample S. In the mode in which the particle beam column 19 emits neutral particle beam as particle beam to the sample S for irradiation, a voltage corresponding to the kinetic energy of ions or more is applied to the retarding electrode, whereby the objective lens 56 limits passage of the ion beam. That is, a voltage for decelerating and blocking the ion beam is applied to the objective lens 56.

The deflector 57 includes, for example, multiple electrodes placed in a tube shape to surround the optical axis of the ion beam. The deflector 57 scans the irradiation position of the ion beam on the sample S. For example, a deflection voltage for 2D scanning is applied so that the deflector 57 raster-scans a rectangular region on the surface of the sample S.

(Processing Process)

Figure 4:
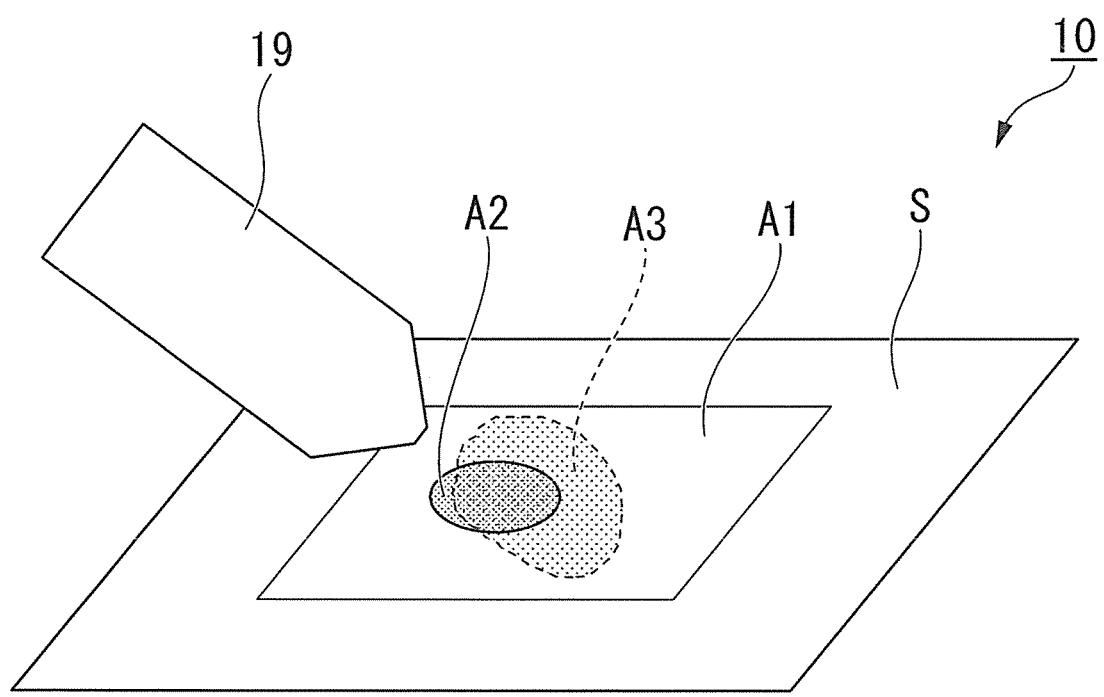
FIG. 4 is a diagram schematically showing an example of a processing process performed by a composite beam apparatus according to an embodiment of the present disclosure.

FIG. 4 is a diagram schematically showing an example of a processing process performed by the composite beam apparatus 10 according to an embodiment.

For example, in processing of a sample S of an insulator, first, the particle beam column 19 emits ion beam to the sample S for irradiation, and a processing point A2, which is a target, within a scanning range A1 is found using a scanning electron image of secondary electrons detected by the secondary charged particle detector 21. Next, the particle beam column 19 emits neutral particle beam to the sample S for irradiation and the processing point A2 is processed.

For example, when the processing point A2 is processed by the ion beam, the ion beam are deformed due to charge-up caused by long-time processing, the action caused by an electromagnetic field, and the like, and thus an undesired-shaped processing point A3, etc. are likely to be acquired. However, according to processing with neutral particle beam, processing with high precision may be performed on a processing point A2, which is a target.

Figure 5:
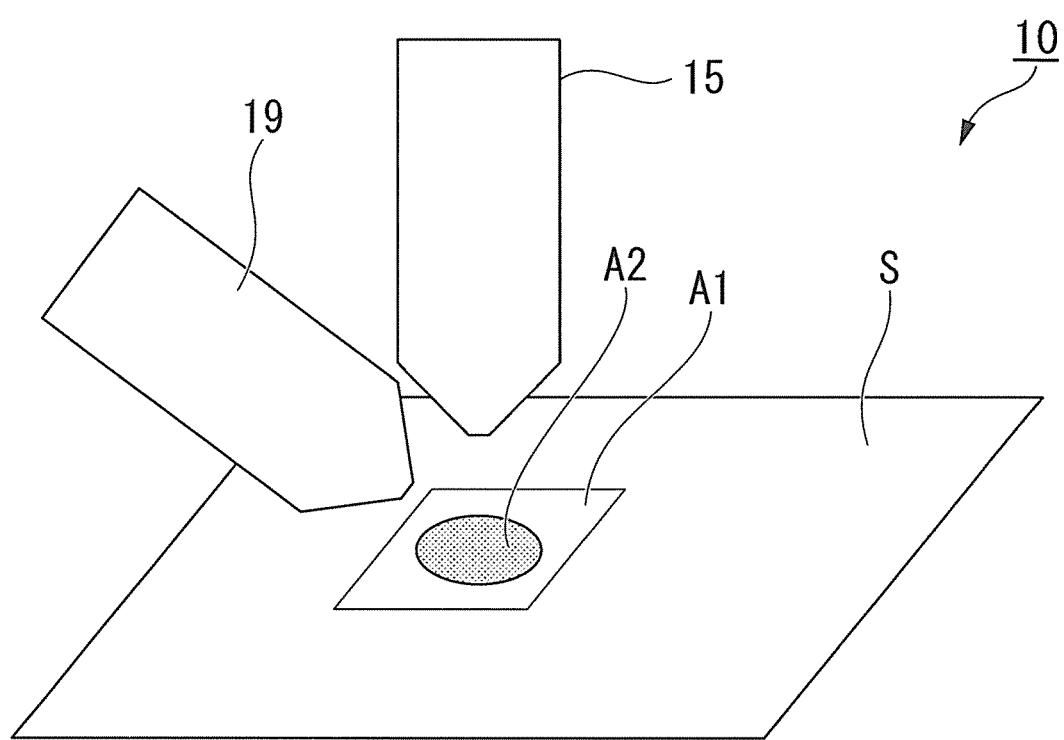
FIG. 5 is a diagram schematically showing another example of a processing process performed by a composite beam apparatus according to an embodiment of the present disclosure.

FIG. 5 is a diagram schematically showing another example of a processing process performed by the particle beam apparatus according to an embodiment.

For example, in processing of a sample S using the electron beam column 15 and the particle beam column 19 together, first, the electron beam column 15 emits electron beam to the sample S for irradiation, and a processing point A2, which is a target, within a scanning range A1 is found using a scanning electron image of secondary electrons detected by the secondary charged particle detector 21. Next, the particle beam column 19 emits neutral particle beam to the sample S for irradiation and the processing point A2 is processed. In addition, observation of the processing point A2 by using a scanning electron image and processing of the processing point A2 by using neutral particle beam may be performed simultaneously. According to processing with neutral particle beam, processing with high precision may be performed without being affected by the action of an electromagnetic field occurring in the electron beam column 15.

As described above, the composite beam apparatus 10 of an embodiment includes the objective lens 56 reducing ion beam downstream of the charge exchange grid 55, so that when the sample S is irradiated with neutral particle beam, ion beam not subjected to neutralization are limited not to irradiate the sample S. Accordingly, appropriate switching selectively between ion beam and neutral particle beam is performed.

In the case of switching between ion beam and neutral particle beam as particle beam with which the sample S is irradiated, the condenser lens 52 changing focusing of ion beam according to the change in the lens power related to the focal length of ion beam is provided, so that neutralization efficiency of ion beam in the charge exchange grid 55 is appropriately changed.

The blanker 53 and the blanking aperture 54 that block ion beam are provided upstream of the charge exchange grid 55, so that irradiation is easily stopped when any one type among ion beam and neutral particle beam is emitted as particle beam to the sample S for irradiation.

By selectively using ion beam and neutral particle beam, the particle beam column 19 is capable of performing detection of a position based on a secondary-electron scanning image using the ion beam and processing with the neutral particle beam.

Since neutralization by charge exchange in the charge exchange grid 55 is performed inside the particle beam column 19, reactive ions, such as oxygen, etc., may be used and compared to gas charge exchange, more compact optics is able to be formed, for example.

(Modification)

Hereinafter, a modification to the embodiment will be described. In addition, the same element as in the above-described embodiment is denoted by the same reference numeral and a description thereof will be omitted or simplified.

In the above-described embodiment, the outward shape of the charge exchange grid 55 is the tube shape having the inner circumferential surface 55c in a concave curved shape, but may be other shapes without being limited thereto. The shape of the surface of the charge exchange grid 55 that performs charge exchange through collision with ions may be, for example, a shape required in order to acquire a desired shape of a neutral particle beam, a desired density of neutral particles, and the like.

Figure 6:
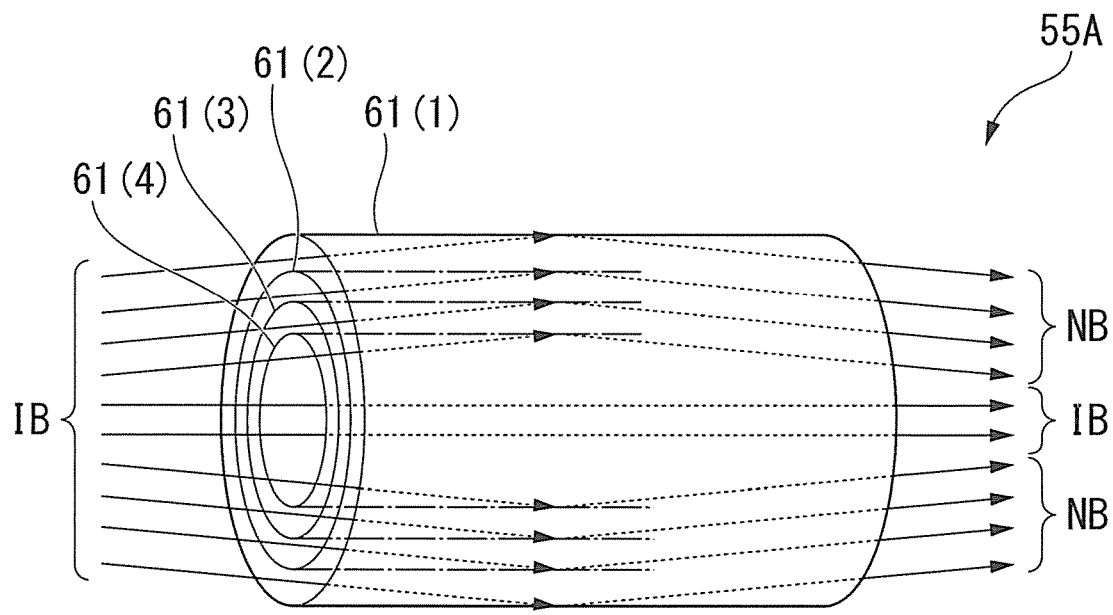
FIG. 6 is a diagram schematically showing a configuration of a charge exchange grid according to a first modification to the embodiment of the present disclosure.

FIG. 6 is a diagram schematically showing a configuration of a charge exchange grid 55A according to a first modification to the embodiment.

In the first modification, an outward shape of the charge exchange grid 55A is, for example, a multi-tube shape composed of multiple tube elements 61 in difference sizes of which the respective central axes match the optical axis of the ion beam. The multiple tube elements 61 are, for example, a first cylinder 61(1), a second cylinder 61(2), a third cylinder 61(3), and a fourth cylinder 61(4).

In the first modification, the charge exchange grid 55A performs charge exchange by making electrons absorbed by a part of ions that are incident at a shallow angle on inner circumferential surfaces of the respective tube elements 61, whereby the ions are converted into neutral particle. In the example shown in FIG. 6, among ion beam Ms incident on the inside of the charge exchange grid 55A, the neutral particle beam NBs neutralized by charge exchange at the inner circumferential surfaces of the respective tube elements 61 and the remaining ion beam IBs which are not subjected to charge exchange are emitted out of the inside of the charge exchange grid 55A toward the objective lens 56.

According to the first modification, neutralization efficiency may be improved by increasing the number of tube elements 61 with which the ion beam collide.

Figure 7:
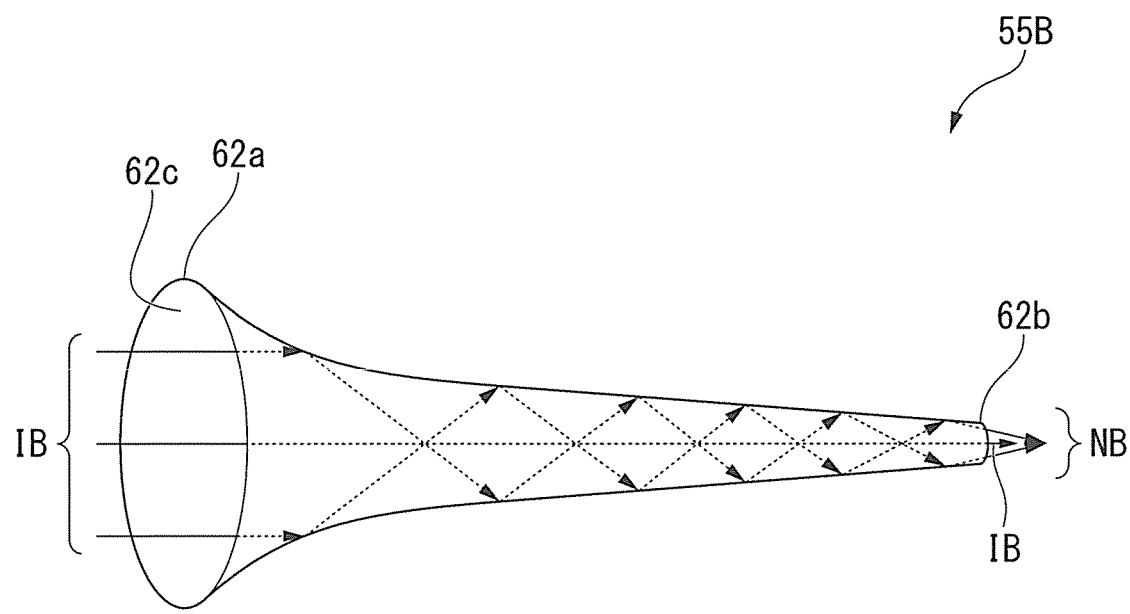
FIG. 7 is a diagram schematically showing a configuration of a charge exchange grid according to a second modification to the embodiment of the present disclosure.

FIG. 7 is a diagram schematically showing a configuration of a charge exchange grid 55B according to a second modification to the embodiment.

In the second modification, an outward shape of the charge exchange grid 55B is, for example, a tube shape of which the central axis matches the optical axis of the ion beam. The charge exchange grid 55B has an inner circumferential surface 62c in a concave curved shape in which the inside diameter gradually decreases starting from an entrance-side end 62a toward an exit-side end 62b in the axis direction of the central axis and the end is narrow.

In the second modification, the charge exchange grid 55B performs charge exchange by making electrons absorbed by a part of ions that are incident at a shallow angle on the inner circumferential surface 62c, whereby the ions are converted into neutral particles. In the example shown in FIG. 7, among ion beam IBs incident on the inside of the charge exchange grid 55B, the neutral particle beam NBs neutralized by charge exchange at the inner circumferential surface 62c several times and the remaining ion beam IBs which are not subjected to charge exchange are emitted out of the inside of the charge exchange grid 55B toward the objective lens 56.

According to the second modification, the shape of the charge exchange grid 55B causes an increase in the number of times that collision with ion beam takes place, thereby improving neutralization efficiency.

In the above-described embodiment, the particle beam column 19 may include an acceleration electrode, and the like for accelerating the ion beam.

Figure 8:
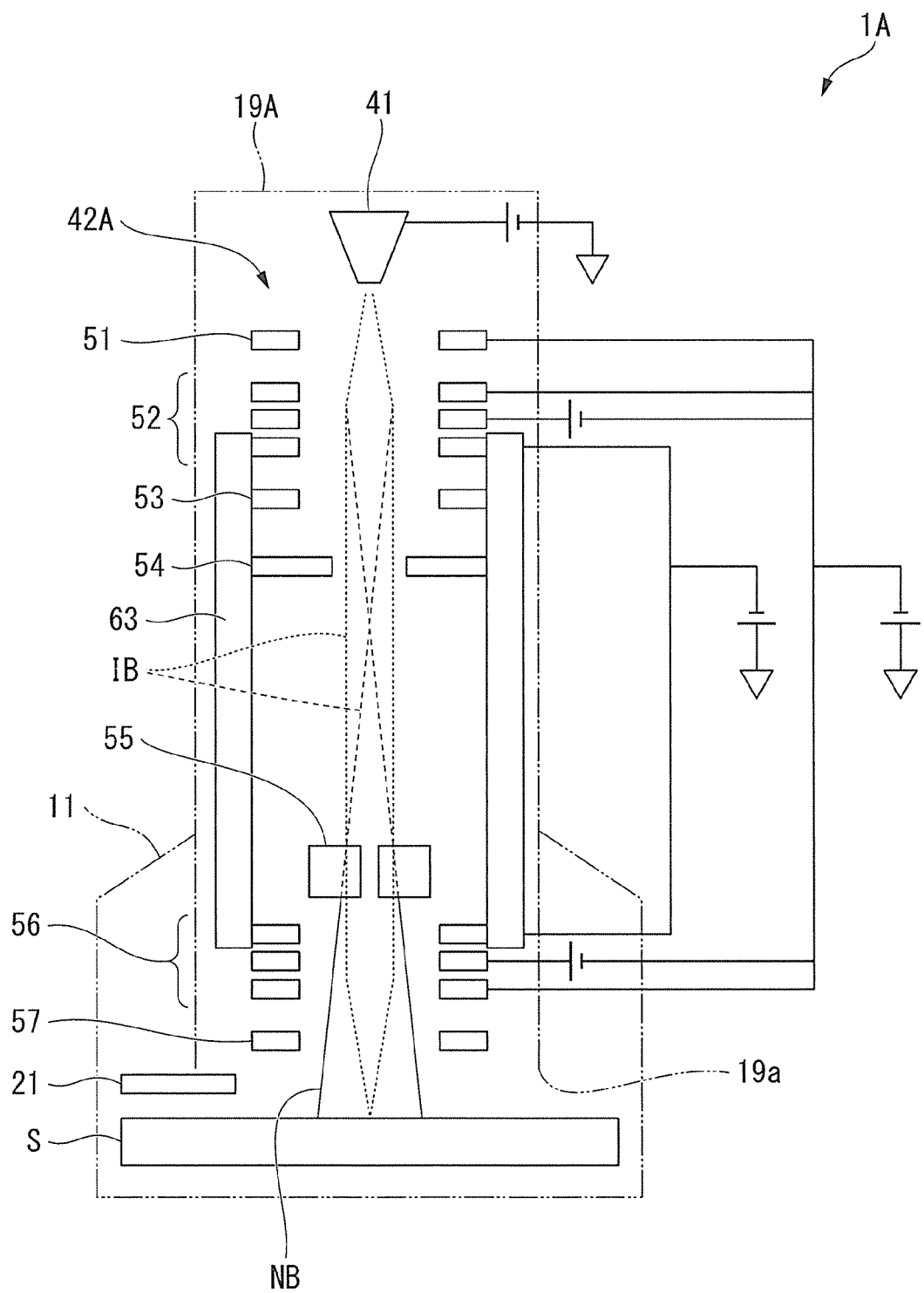
FIG. 8 is a diagram schematically showing a configuration of a particle beam apparatus according to a third modification to the embodiment of the present disclosure.

FIG. 8 is a diagram schematically showing a configuration of a particle beam apparatus 1A according to a third modification to the embodiment.

In the third modification, a particle beam column 19A of the particle beam apparatus 1A includes the ion source 41 and ion optics 42A. The ion optics 42A includes, for example, an acceleration electrode 63 in addition to the ion optics 42 of the above-described embodiment.

The acceleration electrode 63 is, for example, placed between the condenser lens 52 and the objective lens 56, and is placed to surround the blanker 53, the blanking aperture 54, and the charge exchange grid 55. The acceleration electrode 63 reduces aberrations of ion beam and neutral particle beam by increasing the kinetic energy of the ion beam.

According to the third modification, the acceleration electrode 63 accelerating the ion beam is provided, so that the aberrations of the ion beam and the neutral particle beam are reduced, thereby improving the precision of processing or observation of the sample S.

In the above-described embodiment, the particle beam column 19 may include an electron confinement electrode, an electron generating device, and the like for increasing the neutralization efficiency in the charge exchange grid 55.

Figure 9:
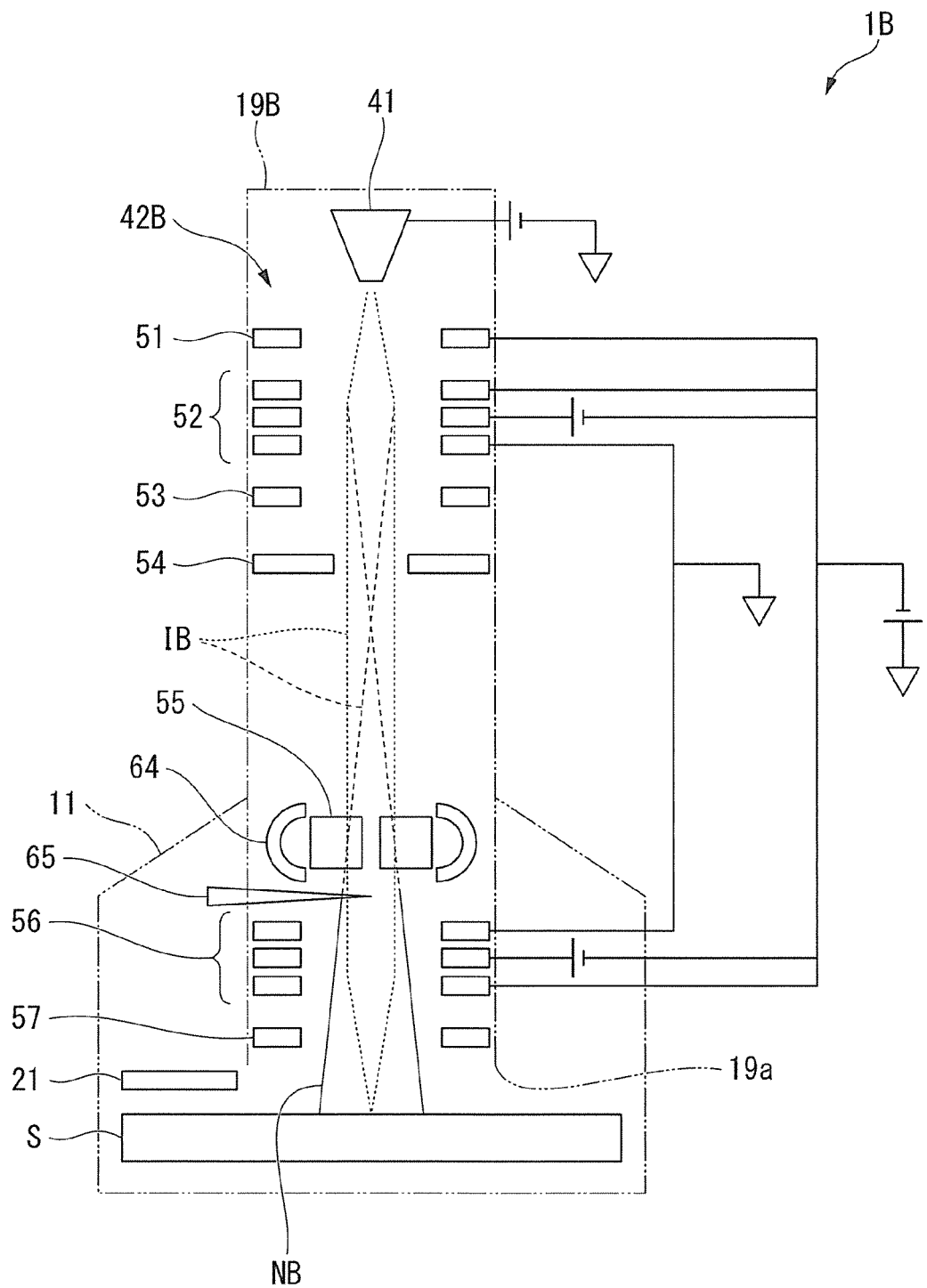
FIG. 9 is a diagram schematically showing a configuration of a particle beam apparatus according to a fourth modification to the embodiment of the present disclosure.

FIG. 9 is a diagram schematically showing a configuration of a particle beam apparatus 1B according to a fourth modification to the embodiment.

Figure 10:
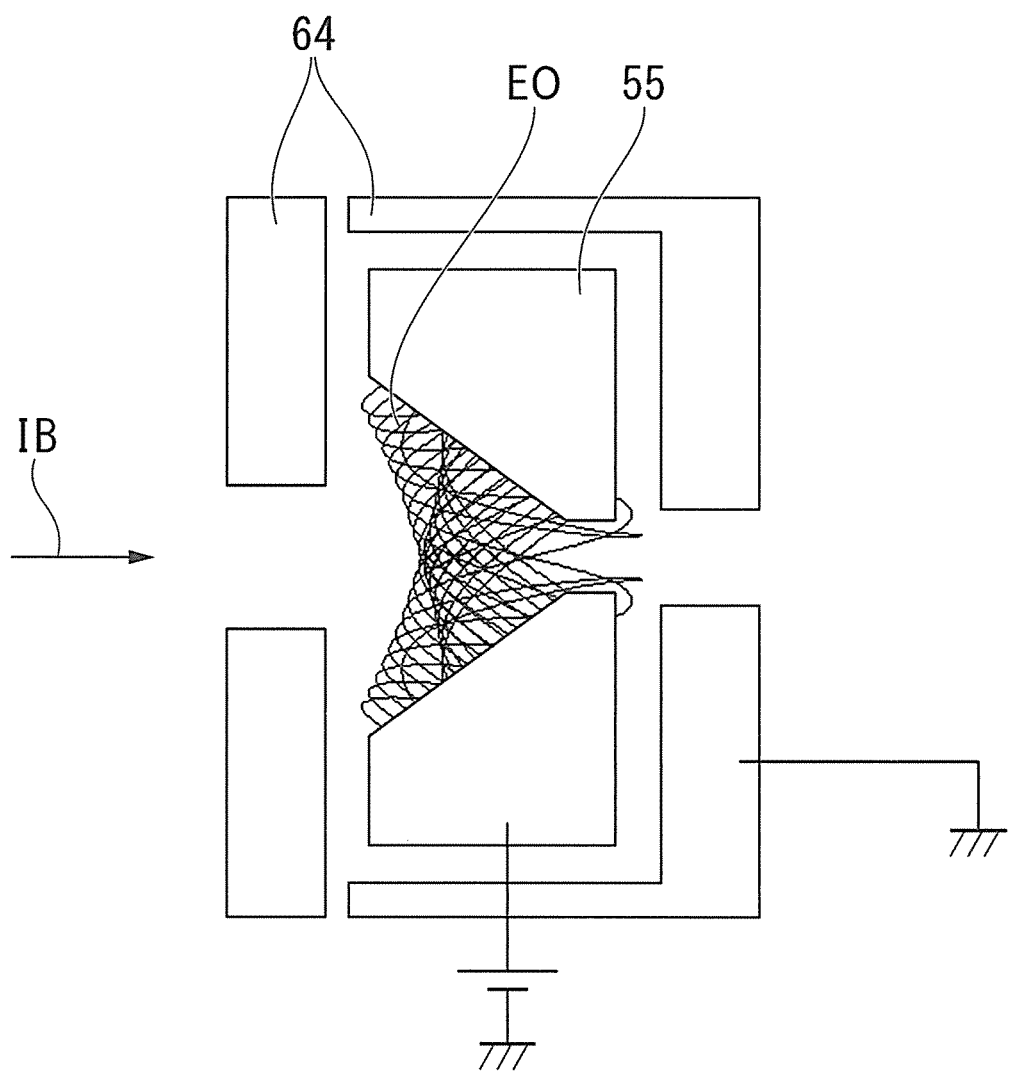
FIG. 10 is a diagram schematically showing a configuration of an electron confinement electrode of a particle beam apparatus according to the fourth modification of the embodiment of the present disclosure.

FIG. 10 is a diagram schematically showing a configuration of an electron confinement electrode 64 according to the fourth modification of the embodiment.

As shown in FIG. 9, in the fourth modification, a particle beam column 19B of the particle beam apparatus 1B includes the ion source 41 and ion optics 42B. The ion optics 42B includes, for example, the electron confinement electrode 64 and an electron generating device 65 in addition to the ion optics 42 of the above-described embodiment.

As shown in FIG. 10, the electron confinement electrode 64 is placed to cover the charge exchange grid 55 without blocking ion beam. As a voltage is applied, the electron confinement electrode 64 generates an electric field that confines secondary electrons generated at the charge exchange grid 55 and primary electrons generated at the electron generating device 65, inside the charge exchange grid 55. In the example shown in FIG. 10, orbits EOs of the secondary electrons generated at the charge exchange grid 55 stay inside the charge exchange grid 55.

The electron confinement electrode 64 confines the electrons inside the charge exchange grid 55, thereby promoting neutralization of ion beam by charge exchange.

As shown in FIG. 9, the electron generating device 65 supplies primary electrons to the inside of the charge exchange grid 55. The electron generating device 65 is, for example, a thermal electron source including a filament, etc. that emits thermal electrons caused by heating. The electron generating device 65 is, for example, placed between the charge exchange grid 55 and the objective lens 56.

According to the fourth modification, the electron confinement electrode 64 and the electron generating device 65 are provided, so that neutralization efficiency in the charge exchange grid 55 may be improved.

In the fourth modification, it is described that the electron generating device 65 is placed outside the electron confinement electrode 64, but without being limited thereto, the electron generating device 65 may be placed inside the electron confinement electrode 64.

Figure 11:
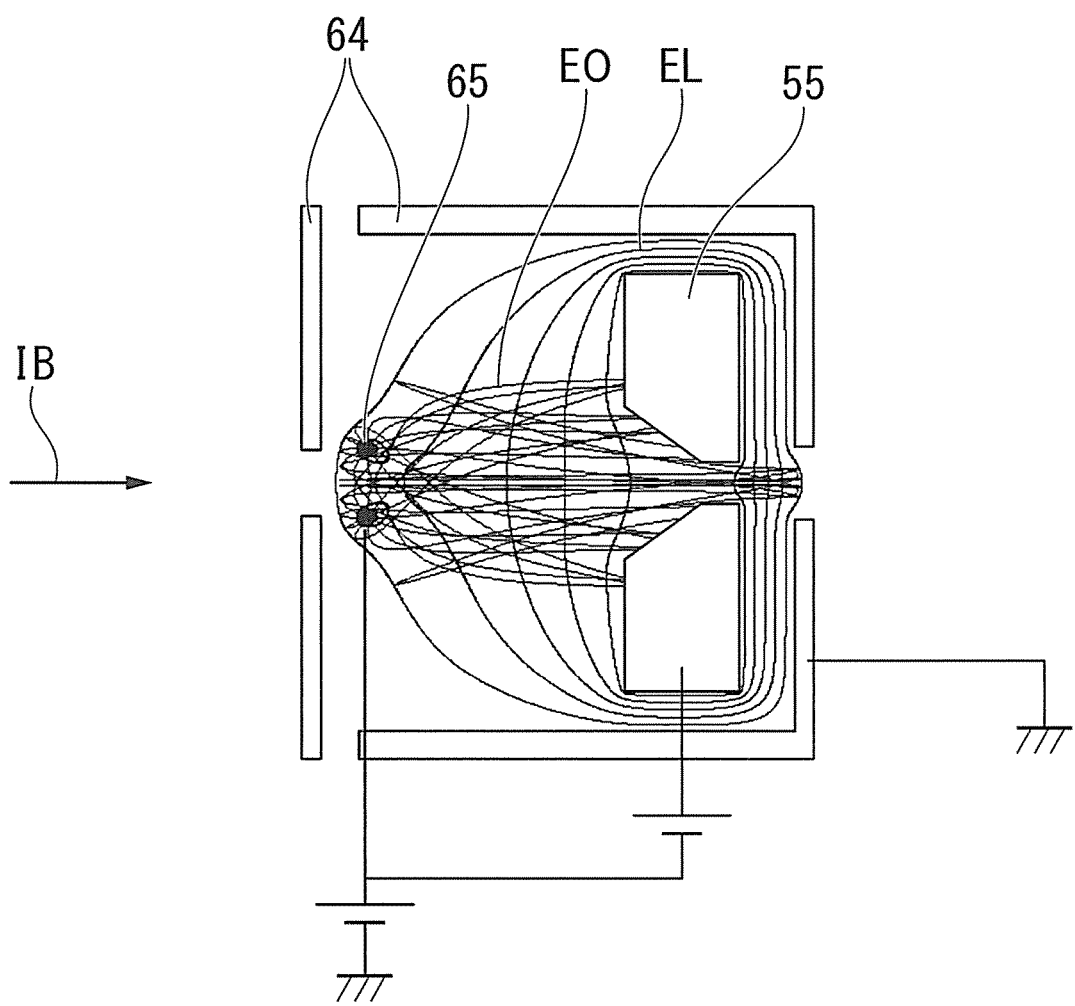
FIG. 11 is a diagram schematically showing a configuration of an electron confinement electrode of a particle beam apparatus according to a fifth modification of the embodiment of the present disclosure.

FIG. 11 is a diagram schematically showing a configuration of an electron confinement electrode 64 according to a fifth modification of the embodiment.

In the fifth modification, an electron generating device 65 is placed inside the electron confinement electrode 64. In the example shown in FIG. 11, by equipotential lines EL formed between the electron confinement electrode 64 and the charge exchange grid 55, orbits EOs of secondary electrons generated at the charge exchange grid 55 and primary electrons generated at the electron generating device 65 stay inside the charge exchange grid 55.

According to the fifth modification, the electron generating device 65 placed inside the electron confinement electrode 64 is provided, so that neutralization efficiency in the charge exchange grid 55 may be improved.

In addition, in the fourth modification and the fifth modification, it is described that the electron confinement electrode 64 and the electron generating device 65 are provided, but without being limited thereto, any one of them may be provided. Further, in the case where the electron confinement electrode 64 is omitted, a voltage may be directly applied to the charge exchange grid 55 and an electric field that confines secondary electrons generated at the charge exchange grid 55 and primary electrons generated at the electron generating device 65, inside the charge exchange grid 55 may be formed.

In the above-described embodiment, it is described that the central axis of the charge exchange grid 55 matches the optical axis of the ion beam, but without being limited thereto, the central axis of the charge exchange grid 55 may be placed to be shifted from the optical axis of the ion beam.

Figure 12:
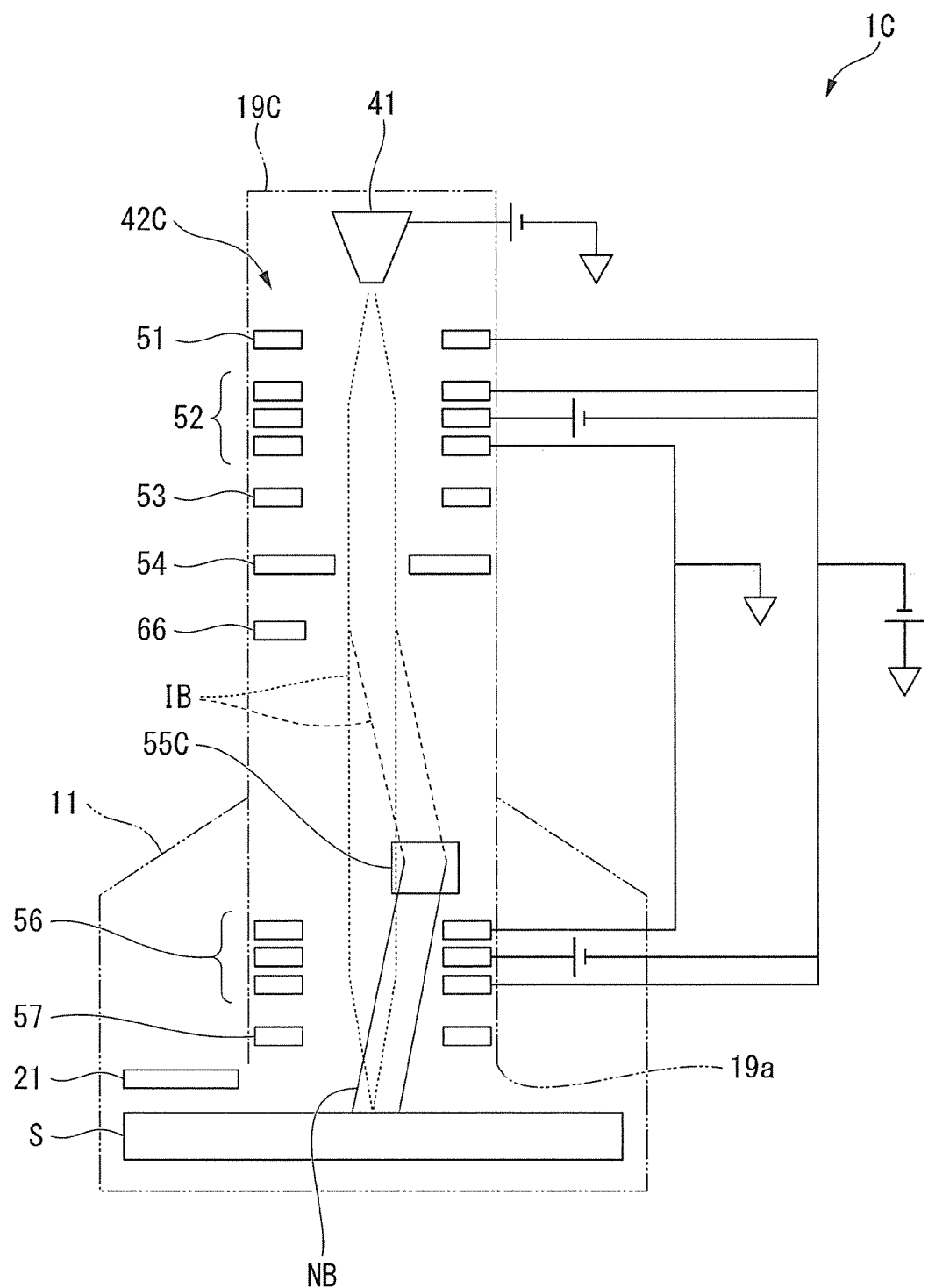
FIG. 12 is a diagram schematically showing a configuration of a particle beam apparatus according to a sixth modification to the embodiment of the present disclosure.
Figure 13:
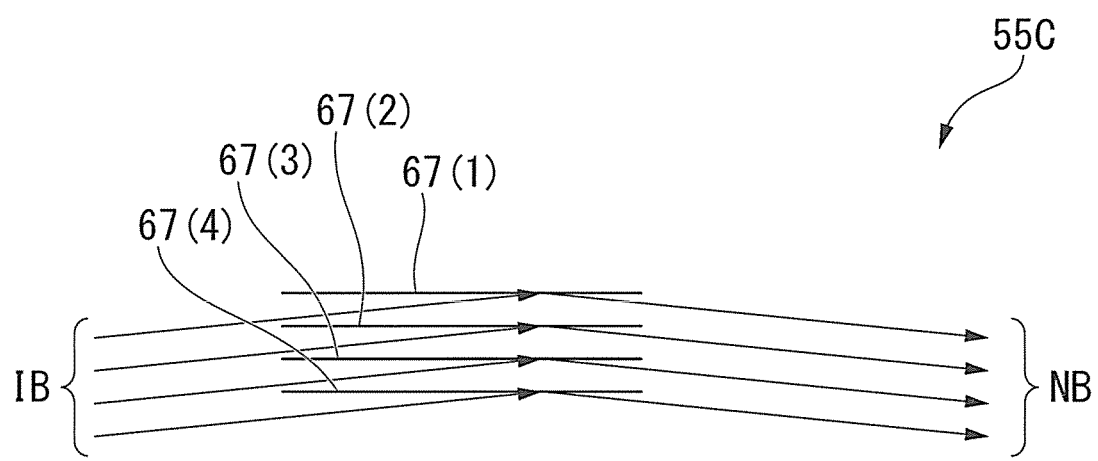
FIG. 13 is a diagram schematically showing a configuration of a charge exchange grid of a particle beam apparatus according to the sixth modification to the embodiment of the present disclosure.

FIG. 12 is a diagram schematically showing a configuration of a particle beam apparatus 1C according to a sixth modification to the embodiment. FIG. 13 is a diagram schematically showing a configuration of a charge exchange grid 55C of the particle beam apparatus 1C according to the sixth modification to the embodiment.

As shown in FIG. 12, in the sixth modification, a particle beam column 19C of the particle beam apparatus 1C includes the ion source 41 and ion optics 42C. The ion optics 42C includes, for example, an upper deflector 66 in addition to the charge exchange grid 55C instead of the charge exchange grid 55 in the ion optics 42 of the above-described embodiment.

In the sixth modification, the charge exchange grid 55C is placed to be shifted from the optical axis of ion beam so that ion beam do not enter the charge exchange grid 55C in a mode in which the particle beam column 19C emits the ion beam as particle beam to a sample S for irradiation.

As shown in FIG. 13, in the sixth modification, an outward shape of the charge exchange grid 55C is, for example, a set of multiple flat plates 67 parallel to the optical axis of the ion beam. The multiple flat plates 67 are, for example, a first flat plate 67(1), a second flat plate 67(2), a third flat plate 67(3), and a fourth flat plate 67(4) that are spaced a predetermined distance apart in the thickness direction and sequentially arranged parallel to each other.

In the sixth modification, the charge exchange grid 55C performs charge exchange by making electrons absorbed by a part of ions that are incident at a shallow angle on surfaces of the respective flat plates 67, whereby the ions are converted into neutral particles. In the example shown in FIG. 13, among ion beam IBs incident on the charge exchange grid 55C, the neutral particle beam NBs neutralized by charge exchange at the surfaces of the respective flat plates 67 reflect off the charge exchange grid 55C toward the objective lens 56.

As shown in FIG. 12, the upper deflector 66 includes, for example, multiple electrodes placed in a tube shape to surround the optical axis of the ion beam. The upper deflector 66 is placed upstream of the charge exchange grid 55C, for example, between the blanking aperture 54 and the charge exchange grid 55C. In the mode in which the particle beam column 19C emits ion beam as particle beam to the sample S for irradiation, for example, as a deflection voltage is not applied, the upper deflector 66 does not deflect the ion beam, but directs the ion beam toward the outside of the charge exchange grid 55C. In the mode in which the particle beam column 19C emits neutral particle beam as particle beam to the sample S for irradiation, for example, as a deflection voltage is applied, the upper deflector 66 deflects the ion beam and directs toward the charge exchange grid 55C.

In the upper deflector 66, for example, the amount of deflection of the ion beam is adjusted according to the applied deflection voltage, so that desired neutralization efficiency in the charge exchange grid 55C and an irradiation position of desired neutral particle beam on the sample S may be changed.

In the sixth modification, when switching between ion beam and neutral particle beam as particle beam, the condenser lens 52 does not need to change focusing of the ion beam.

According to the sixth modification, the upper deflector 66 changing deflection of ion beam when switching is performed between ion beam and neutral particle beam as particle beam with which the sample S is irradiated is provided, so that neutralization efficiency of the ion beam in the charge exchange grid 55 is appropriately changed.

In the above-described embodiment, it is described that even in the mode in which the particle beam column 19 emits ion beam as particle beam to the sample S for irradiation, the ion beam are incident on the charge exchange grid 55, but without being limited thereto, the ion beam may be directed toward the outside of the charge exchange grid 55.

Figure 14:
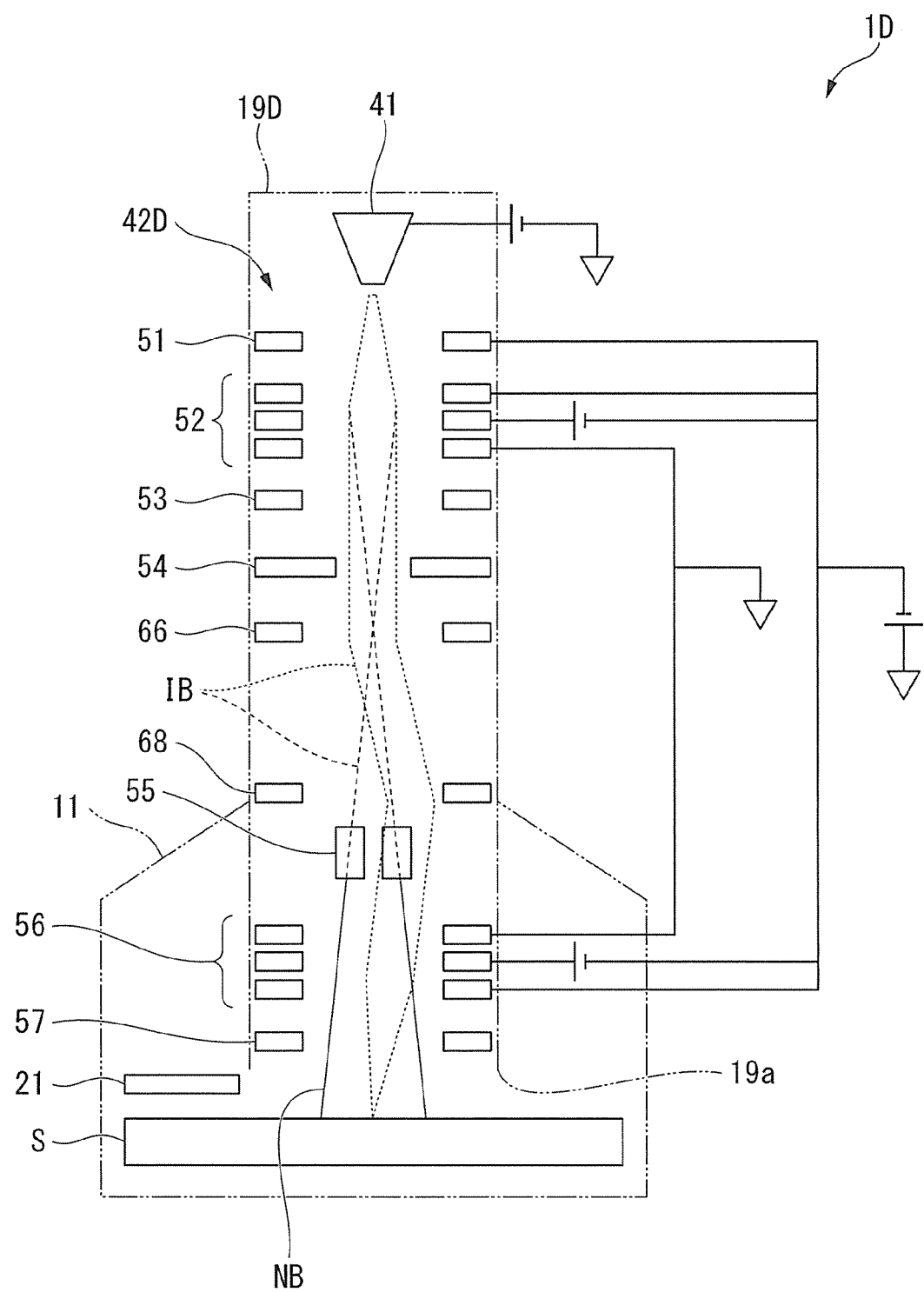
FIG. 14 is a diagram schematically showing a configuration of a particle beam apparatus according to a seventh modification to the embodiment of the present disclosure.

FIG. 14 is a diagram schematically showing a configuration of a particle beam apparatus 1D according to a seventh modification to the embodiment.

In the seventh modification, a particle beam column 19D of the particle beam apparatus 1D includes the ion source 41 and ion optics 42D. The ion optics 42D includes, for example, an upper deflector 66 and a middle deflector 68 in addition to the ion optics 42 of the above-described embodiment.

Each of the upper deflector 66 and the middle deflector 68 includes, for example, multiple electrodes placed in a tube shape to surround the optical axis of the ion beam. The upper deflector 66 and the middle deflector 68 are placed, for example, between the blanking aperture 54 and the charge exchange grid 55C. The upper deflector 66 and the middle deflector 68 are sequentially placed, starting from the ion source 41 toward the beam emitting end portion 19a of the particle beam column 19D (that is, toward the sample S).

In the mode in which the particle beam column 19D emits ion beam as particle beam to the sample S for irradiation, for example, as a deflection voltage is applied, the upper deflector 66 and the middle deflector 68 deflect the ion beam and direct toward the outside of the charge exchange grid 55. In the mode in which the particle beam column 19C emits neutral particle beam as particle beam to the sample S for irradiation, for example, as a deflection voltage is not applied, the upper deflector 66 and the middle deflector 68 do not deflect the ion beam and direct toward the charge exchange grid 55.

According to the seventh modification, the upper deflector 66 and the middle deflector 68 changing deflection of ion beam when switching is performed between ion beam and neutral particle beam as particle beam with which the sample S is irradiated is provided, so that neutralization efficiency of the ion beam in the charge exchange grid 55 is appropriately changed.

In order to equalize irradiation points on the sample S in the composite beam apparatus 10, the particle beam column 19 may include a unit for adjusting the position of the particle beam. For example, the particle beam column 19 may include a deflector placed upstream of the charge exchange grid 55 to adjust the incidence angle of the ion beam minutely, and may include a unit moving the whole particle beam column 19 mechanically. For example, the deflector placed upstream of the charge exchange grid 55 is a deflector for adjusting one horizontal direction and a direction perpendicular thereto on the sample S. The deflector may be integrated with the upper deflector 66 in the sixth modification and the seventh modification or may be separated from the upper deflector 66.

In the above-described embodiment, it is described that the composite beam apparatus 10 includes the electron beam column 15, the focused ion beam column 17 and the particle beam column 19, but no limitation thereto is imposed. For example, the composite beam apparatus 10 may be a composite beam apparatus formed by a combination of the electron beam column 15 and the particle beam column 19.

The embodiments of the present disclosure are provided as examples and are not intended to limit the scope of the present disclosure. These embodiments may be implemented in other forms, and various omissions, substitutions, and modifications may be made without departing from the gist of the present disclosure. These embodiments and their modifications are included in the scope or gist of the present disclosure, as well as being included in the disclosure described in the claims and an equivalent scope thereof.

What is claimed is:

1. A particle beam apparatus, comprising:
a particle beam column irradiating a sample with particle beam;
a charged particle source, which is provided inside the particle beam column and generates charged particles;
a conversion unit converting at least a part of the beam of charged particles generated from the charged particle source to a beam of neutral particles by neutralization inside the particle beam column;
a switching unit switching between a beam of charged particles and a beam of neutral particles as the particle beam inside the particle beam column; and
a reduction unit, which is provided downstream of the conversion unit and reduces the beam of the charged particles directed towards the sample.

2. The particle beam apparatus of claim 1, further comprising:
a blocking unit, which is provided upstream of the conversion unit inside the particle beam column and blocks the beam of the charged particles.

3. The particle beam apparatus of claim 1, further comprising:
an acceleration electrode accelerating the beam of charged particles inside the particle beam column.

4. A composite beam apparatus, comprising:
the particle beam apparatus of claim 1; and
a detector detecting secondary charged particles generated from the sample by irradiation with the beam of the charged particles.

5. The composite beam apparatus of claim 4, further comprising:
an electron beam column irradiating the sample with electron beam.

6. The composite beam apparatus of claim 4 or 5, further comprising:
a focused ion beam column irradiating the sample with focused ion beam.

* * * * *